United States Patent
Barber

(10) Patent No.: US 8,816,673 B1
(45) Date of Patent: Aug. 26, 2014

(54) FREQUENCY EXTENSION MODULE FOR MICROWAVE AND MILLIMETER WAVE SPECTRUM ANALYZERS

(75) Inventor: Richard Glenn Barber, Morgan Hill, CA (US)

(73) Assignee: Anritsu Company, Morgan Hill, CA (US)

( * ) Notice: Subject to any disclaimer, the term of this patent is extended or adjusted under 35 U.S.C. 154(b) by 763 days.

(21) Appl. No.: 13/114,882

(22) Filed: May 24, 2011

(51) Int. Cl.
*G01R 23/02* (2006.01)
*G01R 23/00* (2006.01)

(52) U.S. Cl.
CPC ............... *G01R 23/00* (2013.01); *G01R 23/02* (2013.01)
USPC .................. 324/76.19; 324/76.11; 324/76.23; 324/76.43; 324/91; 324/90

(58) Field of Classification Search
CPC ....... G01R 23/00; G01R 23/005; G01R 23/02
USPC ................................................ 324/76.11–91
See application file for complete search history.

(56) References Cited

U.S. PATENT DOCUMENTS

| | | | | |
|---|---|---|---|---|
| 3,325,731 A | * | 6/1967 | Headle, Jr. | 324/76.23 |
| 3,366,877 A | * | 1/1968 | Kinkel et al. | 324/76.26 |
| 3,581,192 A | * | 5/1971 | Miura et al. | 324/76.31 |
| 4,054,785 A | * | 10/1977 | Lehmann | 708/405 |
| 4,321,680 A | * | 3/1982 | Bertrand et al. | 702/77 |
| 4,504,785 A | * | 3/1985 | Tucker et al. | 324/76.24 |
| 4,578,638 A | * | 3/1986 | Takano et al. | 324/76.23 |
| 4,636,717 A | * | 1/1987 | Sharrit et al. | 324/76.22 |
| 4,641,085 A | * | 2/1987 | Donecker et al. | 324/76.22 |
| 4,641,086 A | * | 2/1987 | Barr et al. | 324/76.22 |
| 4,644,486 A | * | 2/1987 | Cannon et al. | 702/57 |
| 4,661,767 A | * | 4/1987 | Sharrit et al. | 324/638 |
| 4,720,673 A | * | 1/1988 | Hatfield | 324/76.23 |
| 4,816,767 A | * | 3/1989 | Cannon et al. | 324/601 |
| 4,896,102 A | * | 1/1990 | DuBois | 324/76.28 |
| 5,038,097 A | * | 8/1991 | Imanaka | 324/76.24 |
| 5,262,957 A | * | 11/1993 | Hearn | 702/76 |
| 6,140,809 A | * | 10/2000 | Doi | 324/76.24 |
| 6,233,529 B1 | * | 5/2001 | Nonaka | 702/76 |
| 7,002,335 B2 | * | 2/2006 | Shoulders | 324/76.23 |
| 7,061,222 B2 | * | 6/2006 | Shank et al. | 324/76.23 |
| 7,746,052 B2 | * | 6/2010 | Noujeim | 324/76.19 |
| 8,159,208 B2 | * | 4/2012 | Brown et al. | 324/76.23 |

(Continued)

OTHER PUBLICATIONS

Dvorak et al. "Extension of an absolute vector error correction technique to wideband, high-frequency measurements", IET Sci. Meas. Technol., 2009, vol. 3, No. 1, pp. 59-71.*

*Primary Examiner* — Patrick Assouad
*Assistant Examiner* — Lamarr Brown
(74) *Attorney, Agent, or Firm* — Meyer IP Law Group

(57) ABSTRACT

In accordance with an embodiment, an apparatus for analyzing signals comprises a spectrum analyzer and a frequency extension module. The spectrum analyzer includes an IF switch which switches between an internal IF signal and an external IF signal, and a LO coupler which is configured to output a portion of one or more LO signals. The frequency extension module is configured to receive the one or more LO signals from the spectrum analyzer and send an IF signal to the spectrum analyzer. A diplexer band switch is used to direct the low band signals to the spectrum analyzer and to direct the high band signals to the frequency extension module where they are downconverted to the external IF which is output to the IF switch.

24 Claims, 2 Drawing Sheets

(56) References Cited

U.S. PATENT DOCUMENTS

| | | | |
|---|---|---|---|
| 8,179,118 B2* | 5/2012 | Bernard | 324/76.22 |
| 8,514,919 B2* | 8/2013 | Estrada et al. | 375/224 |
| 2002/0097036 A1* | 7/2002 | Bradley | 324/76.19 |
| 2003/0080724 A1* | 5/2003 | Mar | 324/76.52 |
| 2005/0258815 A1* | 11/2005 | Shoulders | 324/76.23 |
| 2006/0206550 A1* | 9/2006 | Uchino | 708/204 |
| 2007/0052406 A1* | 3/2007 | Payne | 324/76.23 |
| 2007/0286269 A1* | 12/2007 | Hill et al. | 375/228 |
| 2008/0238405 A1* | 10/2008 | Marshall et al. | 324/76.12 |
| 2008/0258706 A1* | 10/2008 | Bernard | 324/76.22 |
| 2008/0258707 A1* | 10/2008 | Dunsmore et al. | 324/76.23 |
| 2009/0045798 A1* | 2/2009 | Heah et al. | 324/76.19 |
| 2009/0160430 A1* | 6/2009 | Brown et al. | 324/76.23 |
| 2010/0052652 A1* | 3/2010 | Mitchell et al. | 324/76.19 |
| 2010/0094577 A1* | 4/2010 | Nose et al. | 702/76 |
| 2010/0156438 A1* | 6/2010 | Gorin et al. | 324/624 |
| 2010/0272166 A1* | 10/2010 | Nara | 375/224 |
| 2011/0117869 A1* | 5/2011 | Woodings | 455/226.4 |
| 2011/0202316 A1* | 8/2011 | Crooks | 702/198 |
| 2011/0304318 A1* | 12/2011 | Noujeim et al. | 324/76.24 |
| 2012/0256616 A1* | 10/2012 | Brown et al. | 324/76.23 |
| 2012/0269252 A1* | 10/2012 | Ward | 375/228 |

\* cited by examiner

FREQUENCY EXTENSION MODULE FOR MICROWAVE AND MILLIMETER WAVE SPECTRUM ANALYZERS

BACKGROUND

1. Technical Field

The present invention relates to spectrum analyzers, and in particular to a frequency extension module for microwave and millimeter wave spectrum analyzers.

2. Related Art

Spectrum analyzers are well-known tools which can be used, among other functionality, to determine the composition of various input signals and waveforms. These analyzers can be provided in a variety of form factors from large, stand alone lab equipment to relatively compact portable devices. Spectrum analyzers generally offer a limited bandwidth over which they are operable to analyze input signals.

FIG. 1 shows a prior art spectrum analyzer. As shown in FIG. 1, RF input signals, having frequencies within the bandwidth of the spectrum analyzer are received at RF IN 100. The input signal is processed through switching block 102, multiple channel filters and amps block 104, switching block 106 to the multiple mixers block 108. The processed signal is mixed with local oscillator (LO) signals 110 before being passed to an A-to-D converter 112 after which the results are shown in display 114. Additionally, the spectrum analyzer can be controlled using processor 118. Any signals received outside of the operable bandwidth of the spectrum analyzer will not be analyzed.

FIG. 2 shows a prior art system which provides harmonic mixer frequency extension. As shown in FIG. 2, the frequency of range of the spectrum analyzer 200 can be extended using a harmonic mixer 202 and a diplexer 204. The harmonic mixer has a separate input port 206 from the normal RF input 208 of the spectrum analyzer. The diplexer receives LO signals from the spectrum analyzer which are then mixed at the harmonic mixer with the input signal from input port 206. The resulting IF are then passed back through the diplexer to the spectrum analyzer. Such prior art systems have a number of drawbacks. For example, the system shown in FIG. 2 requires two inputs, and therefore does not allow full band spectral analysis coming from one signal source. Additionally, the use of a harmonic mixer can result in higher conversion loss.

SUMMARY

In accordance with an embodiment, an apparatus for analyzing signals, comprises a spectrum analyzer and a frequency extension module coupled to the spectrum analyzer. The spectrum analyzer includes an IF switch which switches between an internal IF signal, generated at the spectrum analyzer, and an external IF signal, and a LO coupler which is configured to output a portion of one or more LO signals generated at the spectrum analyzer. The frequency extension module is configured to receive one or more LO signals from the spectrum analyzer and send an IF signal to the spectrum analyzer. The frequency extension module includes an RF input port operable to receive high band and low band signals, a diplexer band switch which directs the high band signals to the frequency extension module and directs the low band signals to the spectrum analyzer, an IF output port which sends an IF signal to the spectrum analyzer at the IF switch, and a LO input port which receives at least one LO signal from the LO coupler at the spectrum analyzer.

BRIEF DESCRIPTION OF THE DRAWINGS

Further details of the present invention are explained with the help of the attached drawings in which.

DETAILED DESCRIPTION

Embodiments of the present invention relate to circuitry and modules which extend the frequency range of a spectrum analyzer. In accordance with an embodiment, a frequency extension module can be internally added to a spectrum analyzer system. The extension module can extend the RF input operating range of the analyzer from the standard low band frequency range to an extended frequency range. Additionally, a digitally controlled diplexer band switch can be used to enable the spectrum analyzer to function over the low band frequency range and over the extended frequency range during each sweep.

In accordance with an embodiment, an apparatus for analyzing signals, comprises a spectrum analyzer and a frequency extension module coupled to the spectrum analyzer. The spectrum analyzer includes an IF switch which switches between an internal IF signal, generated at the spectrum analyzer, and an external IF signal, and a LO coupler which is configured to output a portion of one or more LO signals generated at the spectrum analyzer. The frequency extension module is configured to receive one or more LO signals from the spectrum analyzer and send an IF signal to the spectrum analyzer. The frequency extension module includes an RF input port operable to receive high band and low band signals, a diplexer band switch which directs the high band signals to the frequency extension module and directs the low band signals to the spectrum analyzer, an IF output port which sends an IF signal to the spectrum analyzer at the IF switch, and a LO input port which receives at least one LO signal from the LO coupler at the spectrum analyzer.

Figure 1:
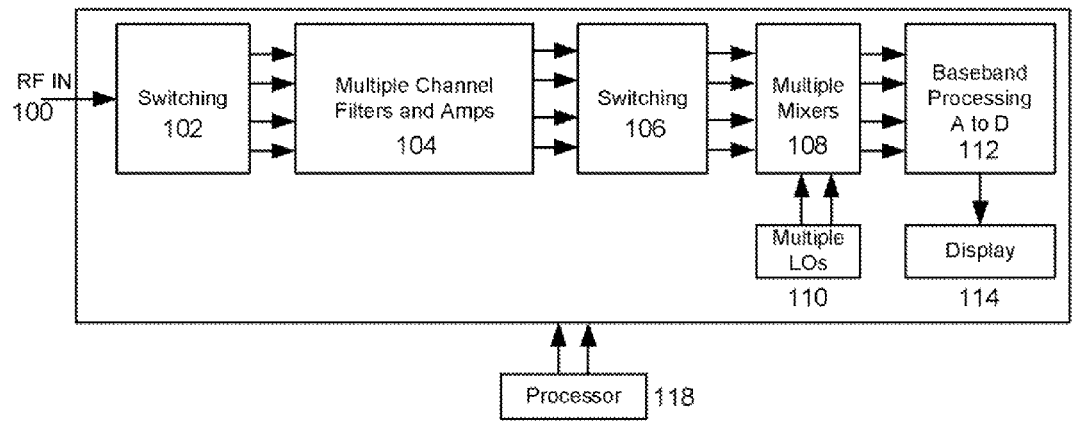
FIG. 1 shows a prior art spectrum analyzer.
Figure 2:
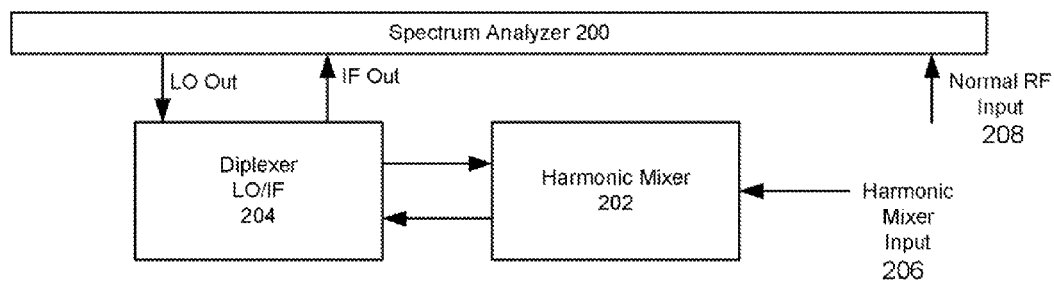
FIG. 2 shows a prior art system which provides harmonic mixer frequency extension.
Figure 3:
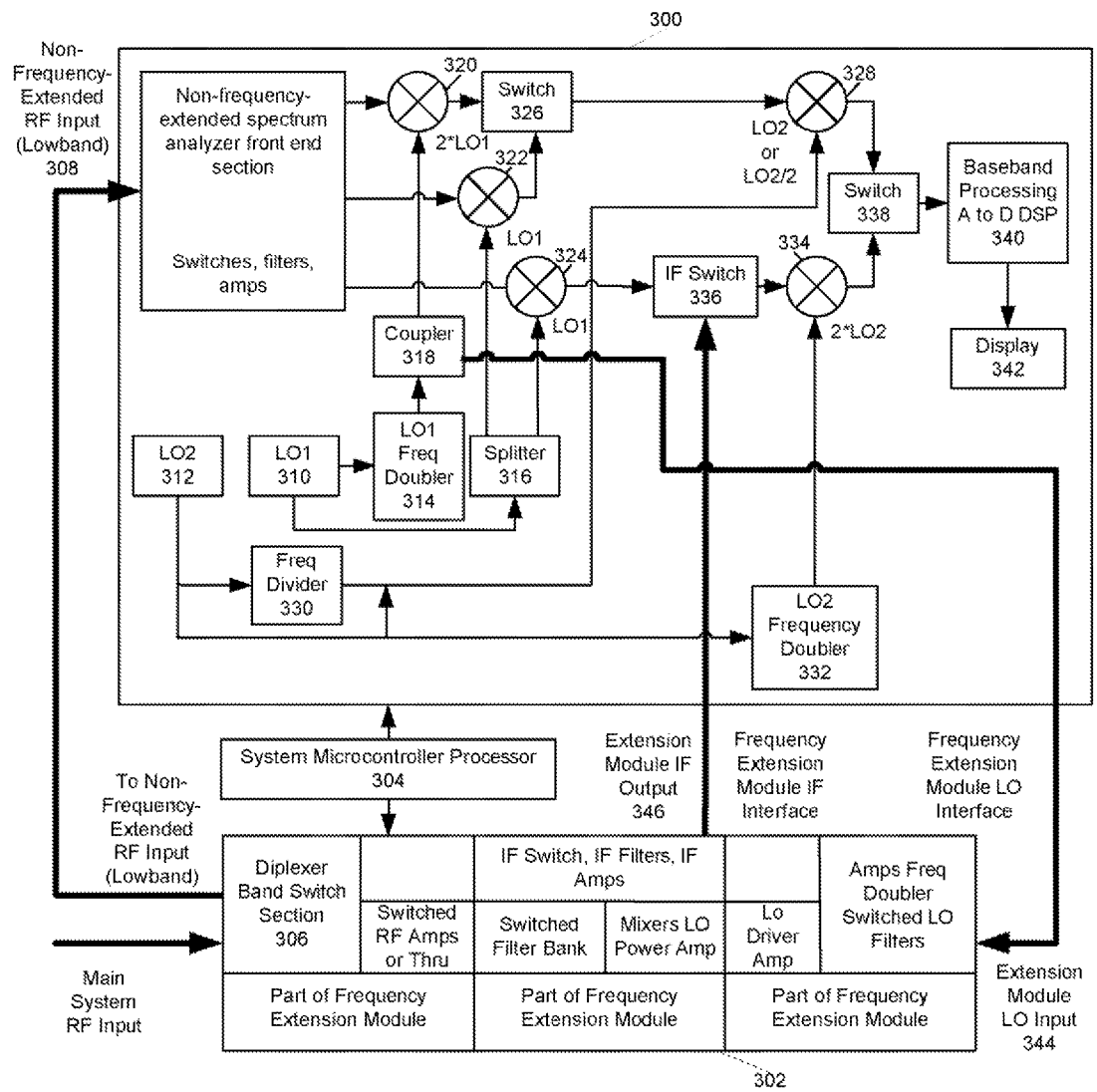
FIG. 3 shows a block diagram of a portable user interface, in accordance with an embodiment.

FIG. 3 shows a device that includes a spectrum analyzer and a frequency extension module, in accordance with an embodiment. As shown in FIG. 3, spectrum analyzer 300 and frequency extension module 302 are controlled by system microcontroller processor 304. The main system RF input is provided at the frequency extension module. Thus, compared to systems of the prior art which required two inputs, the embodiment shown in FIG. 3 can operate over the low or high band using a single input. A diplexer band switch 306 can be used to send the low band signals, i.e., those signals that are within the unextended bandwidth of the spectrum analyzer, to the spectrum analyzer front end 308. Similarly, the diplexer band switch can also be used to send the high band signals, i.e., those signals that are within the extended bandwidth of the spectrum analyzer, to the frequency extension module for further processing.

The spectrum analyzer can provide a plurality of LO signals, such as LO1 310 and LO2 312. These LO signals can be passed through frequency multipliers and/or dividers to provide additional signals. For example, in FIG. 3, LO1 is output to frequency doubler 314 and splitter 316. The new signal (2*LO1) is passed through a coupler 318 and on to mixer 320 where it is mixed with the output of the spectrum analyzer front end. The splitter provides a LO1 signal to each of mixers 322 and 324 where they are also mixed with outputs from the spectrum analyzer front end. Switch 326 receives the outputs of mixers 320 and 322 and outputs a signal to mixer 328. Similarly, LO2 is passed through frequency divider 330 and frequency doubler 332, thereby providing a LO2/2 signal to mixer 328 and a 2*LO2 signal to mixer 334. Mixer 334 also receives the output of IF switch 336. Switch 338 receives the output of mixers 328 and 334 and passes an output signal to Baseband Processing A to D DSP 340 for post processing, the output of which is displayed on display 342.

In accordance with an embodiment, and as shown in FIG. 3, the spectrum analyzer can provide one or more of the LO sub harmonic signals, such as LO1 and LO2, to the frequency extension module. Although in the embodiment shown in FIG. 3, only the 2*LO1 signal is provided to the frequency extension module, in other embodiments a different LO signal or a plurality of LO signals can be provided to the extension module. Coupler 318 extracts a portion of the 2*LO1 signal output from frequency doubler 314 and passes it to the LO input 344 of the frequency extension module.

In accordance with an embodiment, the spectrum analyzer can also provide IF path switching using IF switch 336. When processing the non-extended frequency band, the spectrum analyzer can use one of its mixer output IFs, such as the output from mixer 324. The extension module's IF output 346 can be selectively switched-in while the module is down-converting the extended frequency band(s). For example, the spectrum analyzer may be operable over the band 9 KHz up to 20 GHz and the frequency extension module may be configured to extend the operable range of 20 GHz to 43 GHz. Thus, for low band input signals in the unextended band between 9 KHz and 20 GHz, the diplexer band switch will send the low band input signals to the spectrum analyzer front end, where they will be processed and the IF generated at the spectrum analyzer is used. Similarly, for high band input signals the diplexer band switch sends the high band input signals to the frequency extension module and the IF generated at the frequency extension module is used. Although specific frequency bands such as these are described, this is merely for simplicity of explanation, other operable frequency ranges and extensible frequency ranges are similarly possible.

In accordance with an embodiment, the extension module is controlled by the system microcontroller processor (hereafter referred to as the microcontroller). The microcontroller can enable selection of RF receive and LO filters. Additionally, the microcontroller can control diplexer band switching, RF preamplifier switching, and power supplies, as well as allow for temporary disconnection of transmission paths within the module to avoid leakage and spurious signals. The RF preamps can be bypassed for high level operation, or they can be switched in to provide a lower noise figure. Additionally, LO power can be switched to more than one mixer.

In accordance with an embodiment, testability can be improved by switching in test monitor ports. The generation of spurious signals within the extension module can be minimized by temporarily disconnecting LO power from one or more of the mixers, without turning the spectrum analyzer off. Thus, when the frequency extension module is idle, the spectrum analyzer can continue to function without the risk of generating spurious signals.

As shown in FIG. 3, the coupled output portion of the spectrum analyzer's 2*LO1 is supplied to the frequency extension module. Additionally, a processor controlled switch allows direct IF connection from the extension module output into one of the analyzer's IF paths. The IF sent from the extension module output shown in FIG. 3 can be a fixed frequency or other frequency arrangements are possible. The frequency extension module's IF signal can thus be analyzed and displayed using the same circuitry of the spectrum analyzer following the IF insertion point. Additionally, the coupled LO and the IF insert locations are mechanically arranged to allow easy mechanical connection between spectrum analyzer and the extension module.

As described above, and in accordance with an embodiment, the frequency extension module extends the operating range of the spectrum analyzer to which it is paired. However, the spectrum analyzer does not need the frequency extension module in place to function over its original low band operating range. The extension module uses high performance circuit construction suitable for higher frequencies including the millimeter range. The module provides a mounting environment for monolithic microwave integrated circuits (MMICs) and thin film circuitry. LO multiplication, LO filtering, multiple mixer channels, RF image rejection filtering, RF preamps, and a diplexer band switch can also be provided inside the module.

In accordance with an embodiment, the diplexer band switch provides low distortion signal routing of high band and low band signals, while limiting signal leakage between the high band and the low band. High band signals can be switched into the extension module for frequency down conversion. The low band can be switched into the main spectrum analyzer's front end for non-extended frequency range processing when the module is not needed for conversion. The low leakage feature of the diplexer keeps the high band signal from leaking out the low band diplexer port, thus avoiding high band amplitude ripple.

In accordance with an embodiment, the diplexer band switch can include a plurality of PIN diodes arranged in a distributed manner along a low band output low pass filter. The PIN diodes parasitic inductance can be made to resonate with the capacitors upon which they mount at several frequencies across the high band. This puts multiple transmission zeros at high band frequencies along the low band path during high band operation (e.g., when the module is not idle). This can reduce high band leakage through the low band port which otherwise would cause amplitude ripple in the high band. Without leakage suppression, a standing wave between the band switch low band output and lowband spectrum analyzer input would exist. This standing wave can cause high band ripple during high band down-conversion.

In accordance with an embodiment, the frequency extension module can be comprised of multiple smaller modules interconnected using blindmate connectors. The result is a small integrated frequency extension module with robust manufacturability using high yield assembly processes. Additionally, the frequency extension module can provide frequency multiplication and LO amplification, which allows for the use of fundamental mixers. This keeps the conversion loss and the noise figures low when compared to the use of harmonic mixers of prior art spectrum analyzers. In accordance with an embodiment, the frequency extension module can take on other forms of construction including one or more sub-modules supporting chip and wire assembly. It could also be comprised of soft board planar assembly or waveguide designs.

In accordance with an embodiment, the frequency extension module's LO input frequency can be multiplied one or more times to achieve the final desired LO frequency to drive the mixers. The frequency extension module can include a plurality of mixers used to support the bandwidth, and the mixers can be fundamental or harmonic. Image reject mixers can also be used if 90 degree hybrids are provided. The electronics of the module can also be provided by an integrated chipset including MMICS and MIMS. If more than one module is used they can be integrated using blindmate RF connections or they could also be connected by other transmission lines such as coaxial cables. Alternatively, multiple carriers containing the electronics can be integrated together into a single housing.

Although the present invention has been described above with particularity, this was merely to teach one of ordinary skill in the art how to make and use the invention. Many additional modifications will fall within the scope of the invention, as that scope is defined by the following claims.

What is claimed:

1. An apparatus for analyzing signals, comprising:
  a spectrum analyzer, wherein the spectrum analyzer includes
    an IF switch which switches between an internal IF signal, generated at the spectrum analyzer, and an external IF signal, and
    a LO coupler which is configured to output a portion of one or more LO signals generated at the spectrum analyzer;
  a frequency extension module coupled to the spectrum analyzer, wherein the frequency extension module is configured to receive one or more LO signals from the spectrum analyzer and send an IF signal to the spectrum analyzer; and
  wherein the frequency extension module includes
    an RF input port operable to receive high band and low band signals,
    a diplexer band switch which directs the high band signals to the frequency extension module and directs the low band signals to the spectrum analyzer,
    an IF output port which sends an IF signal to the spectrum analyzer at the IF switch, and
    a LO input port which receives at least one LO signal from the LO coupler at the spectrum analyzer.

2. The apparatus of claim 1 wherein when the high band signals are received at the RF input port,
  the diplexer band switch directs the high band signals to the frequency extension module,
  the frequency extension module creates an external IF signal by downconverting a frequency of the high band signals to an IF frequency, and
  the frequency extension module outputs the external IF signal to the IF switch at the spectrum analyzer.

3. The apparatus of claim 1 wherein the frequency extension module is comprised of a plurality of submodules, wherein each submodule provides different functionality.

4. The apparatus of claim 1 wherein the frequency extension module further includes a LO submodule coupled to the LO input port, wherein the LO submodule includes one or more of an amplifier, a filter and a frequency multiplier.

5. The apparatus of claim 1 wherein the diplexer band switch includes one or more PIN diodes to minimize distortion and leakage between a high band signal path and a low band signal path.

6. The apparatus of claim 5 wherein a diode inductance of each of the PIN diodes is selected to resonate with capacitors in the diplexer band switch to create at least one transmission zero.

7. A frequency-extendable spectrum analyzer, comprising:
  an input port configured to receive an RF input in a first bandwidth from a frequency extension module;
  one or more LO signal generators;
  a LO coupler which is configured to output a portion of the one or more LO signals generated at the spectrum analyzer;
  one or more mixers which mix the RF input with the one or more LO signals to create an internal IF signal;
  an IF switch configured to receive the internal IF signal and an external IF signal from the frequency extension module, and which can selectively output either the internal IF signal or the external IF signal;
  a processor configured to receive, and perform post processing on, the output from the IF switch; and
  a display.

8. The frequency-extendable spectrum analyzer of claim 7 wherein the external IF signal is generated by the frequency extension module by mixing the portion of the one or more LO signals from the LO coupler and an RF input outside the first bandwidth.

9. The frequency-extendable spectrum analyzer of claim 7 wherein the input port is coupled to a diplexer band switch at the frequency extension module and wherein the diplexer band switch directs RF signals in the first bandwidth to the input port and directs RF signals outside the first bandwidth to the frequency extension module.

10. The frequency-extendable spectrum analyzer of claim 7 further comprising a plurality of LO frequency multipliers and frequency dividers configured to generate LO signals having a plurality of different frequencies.

11. The frequency-extendable spectrum analyzer of claim 10 wherein the diplexer band switch includes one or more PIN diodes to minimize distortion and leakage between a high band signal path and a low band signal path.

12. The frequency-extendable spectrum analyzer of claim 11 wherein a diode inductance of each of the PIN diodes is selected to resonate with capacitors in the diplexer band switch to create at least one transmission zero.

13. A frequency extension module, operable to extend the operating range of a spectrum analyzer, comprising:
  an RF input port operable to receive high band and low band RF signals;
  a LO input port configured to receive one or more LO signals from a spectrum analyzer;
  an IF output configured to send an IF signal to the spectrum analyzer;
  a diplexer band switch, coupled to the RF input port, which is configured to direct the high band RF signals to the frequency extension module and to direct the low band RF signals to the spectrum analyzer; and
  wherein when the high band signals are received at the RF input port,
    the diplexer band switch directs the high band signals to the frequency extension module,
    the frequency extension module creates an external IF signal by downconverting a frequency of the high band signals to an IF frequency, and
    the frequency extension module outputs the external IF signal to the spectrum analyzer.

14. The frequency extension module of claim 13 further comprising a plurality of submodules, wherein each submodule provides a different functionality.

15. The frequency extension module of claim 13 wherein the diplexer band switch includes one or more PIN diodes to minimize distortion and leakage between a high band signal path and a low band signal path.

16. The frequency extension module of claim 15 wherein a diode inductance of each of the PIN diodes is selected to resonate with capacitors in the diplexer band switch to create at least one transmission zero.

17. The frequency extension module of claim 13 further comprising a LO submodule coupled to the LO input port, wherein the LO submodule includes one or more of an amplifier, a filter and a frequency multiplier.

18. The frequency extension module of claim 13, wherein the frequency extension module and the spectrum analyzer are packaged into a single unit.

19. The frequency extension module of claim 18, the single unit is a portable unit powered by at least one of a battery pack and an AC adapter.

20. The frequency extension module of claim 18, the single unit is a desktop unit powered by at least one of a battery pack and an AC adapter.

21. An apparatus for analyzing signals, comprising:
- a spectrum analyzer operable to analyze signals within a first bandwidth; and
- a frequency extension module coupled to the spectrum analyzer, wherein the frequency extension module is configured to extend an operable range of the spectrum analyzer to a second bandwidth;
- wherein the frequency extension module includes
  - an RF input port operable to receive high band and low band signals, and
  - a diplexer band switch which directs the high band signals to the frequency extension module and directs the low band signals to the spectrum analyzer.

22. The apparatus of claim 21 wherein the frequency extension module is comprised of a plurality of submodules, wherein each submodule provides different functionality.

23. The apparatus of claim 21, wherein the frequency extension module and the spectrum analyzer are packaged into a single unit.

24. The apparatus of claim 21, wherein the frequency extension module further includes:
- an IF output port which sends an IF signal to the spectrum analyzer at the IF switch, and
- a LO input port which receives at least one LO signal from the LO coupler at the spectrum analyzer.

* * * * *